United States Patent [19]

Tsai et al.

[11] Patent Number: 5,292,370
[45] Date of Patent: Mar. 8, 1994

[54] COUPLED MICROWAVE ECR AND RADIO-FREQUENCY PLASMA SOURCE FOR PLASMA PROCESSING

[75] Inventors: Chin-Chi Tsai, Oak Ridge; Halsey H. Haselton, Knoxville, both of Tenn.

[73] Assignee: Martin Marietta Energy Systems, Inc., Oak Ridge, Tenn.

[21] Appl. No.: 930,590

[22] Filed: Aug. 14, 1992

[51] Int. Cl.$^5$ .............................................. C23C 16/50
[52] U.S. Cl. ............................ 118/723 MP; 156/345; 118/715; 118/723 MR; 118/723 ER
[58] Field of Search ..................... 118/723; 156/345; 315/111.21, 111.41, 111.71; 427/569, 575

[56] References Cited

U.S. PATENT DOCUMENTS

| | | | |
|---|---|---|---|
| 4,585,668 | 4/1986 | Asmussen et al. | 427/38 |
| 4,630,566 | 12/1986 | Asmussen et al. | 118/50.1 |
| 4,691,662 | 9/1987 | Roppel et al. | 118/50.1 |
| 4,727,293 | 2/1988 | Asmussen et al. | 315/111.41 |
| 4,832,981 | 5/1989 | Yamazaki | 118/723 X |
| 4,906,900 | 3/1990 | Asmussen | 315/111.81 |
| 4,943,345 | 7/1990 | Asmussen et al. | 118/728 X |
| 4,960,071 | 10/1990 | Akahori et al. | 118/723 X |
| 4,971,832 | 11/1990 | Arai et al. | 118/723 X |
| 5,032,202 | 7/1991 | Tsai et al. | 156/345 |
| 5,079,481 | 1/1992 | Moslehi | 18/723 X |
| 5,081,398 | 1/1992 | Asmussen et al. | 315/111.41 |
| 5,110,619 | 5/1992 | Ogumi et al. | 118/723 X |
| 5,181,986 | 1/1993 | Ohiwa | 156/345 X |

FOREIGN PATENT DOCUMENTS 61-127862 6/1986 Japan.
62-55924 3/1987 Japan.

OTHER PUBLICATIONS

C. M. Melliar-Smith and C. J. Mogab, "Plasma-Assisted Etching Techniques for Pattern Delineation," in *Thin Film Processes* (J. L. Vossen and W. Kern, Eds.), Academic Press, New York, Chapt. V-2 (1978) pp. 497–556.

Primary Examiner—Tom Thomas
Assistant Examiner—Jonathan D. Baskin
Attorney, Agent, or Firm—James M. Spicer; H. W. Adams

[57] ABSTRACT

In a dual plasma device, the first plasma is a microwave discharge having its own means of plasma initiation and control. The microwave discharge operates at electron cyclotron resonance (ECR), and generates a uniform plasma over a large area of about 1000 cm$^2$ at low pressures below 0.1 mtorr. The ECR microwave plasma initiates the second plasma, a radio frequency (RF) plasma maintained between parallel plates. The ECR microwave plasma acts as a source of charged particles, supplying copious amounts of a desired charged excited species in uniform manner to the RF plasma. The parallel plate portion of the apparatus includes a magnetic filter with static magnetic field structure that aids the formation of ECR zones in the two plasma regions, and also assists in the RF plasma also operating at electron cyclotron resonance.

8 Claims, 4 Drawing Sheets

COUPLED MICROWAVE ECR AND RADIO-FREQUENCY PLASMA SOURCE FOR PLASMA PROCESSING

This invention was made with Government support under contract no. DE-AC05-84OR21400 awarded by the U. S. Department of Energy. The Government has certain rights in this invention.

BACKGROUND OF THE INVENTION

1. Technical Field

This invention relates generally to vacuum deposition and etching apparatus, and more particularly to a plasma source utilizing coupled ECR microwave and radio-frequency (RF) plasmas; the apparatus particularly employing line cusp magnetic multipole structures in both plasma regions for enhancing plasma confinement and producing a uniform plasma over a large substrate area, and also incorporating an electrically-biased magnetic filter for controlling the properties of the ECR microwave and RF plasmas.

2. Prior Art

In U. S. Pat. No. 5,032,202, one of the inventors provided an improved ECR microwave plasma source featuring a magnetic multipole construction for both the plasma confinement and plasma generation, and which also provides a uniform plasma for large area plasma processing. Like ECR microwave plasma sources before it, the plasma source relies solely on microwave energy to produce its plasma. In microwave plasma sources, variations of the plasma uniformity are a sensitive function of gas pressure and magnetic field in the microwave launcher.

Parallel plate radio-frequency (RF) reactors are another type of vacuum deposition and etching apparatus. See, for example, C. M. Melliar-Smith and C. J. Mogab, "Plasma-Assisted Etching Techniques for Pattern Delineation", in *Thin Film Processes* (J. L. Vossen and W. Kern, Eds.), Academic Press, New York, Chapt. V-2 (1978) pp.497–556. It is well known with parallel plate radio-frequency (RF) reactors that it is difficult to produce desired high density and uniform plasma at low pressures below 1 mtorr. Low pressures are desired to minimize gas scattering because the uniformity and directionality become more important as the sub-features are reduced in size for manufacturing of the electronics.

Recently, the use of electron cyclotron resonance (ECR) modes and static magnetic field structures have been reported in connection with parallel plate RF reactors (U. S. Pat. Nos. 4,585,668; 4,630,566; 4,691,662; 4,727,293; 4,906,900; and 5,081,398).

In one of these pats. 4,691,662, Roppel et al feeds charged excited species to the active RF plasma from a physically separated ECR microwave disk plasma. Roppel characterizes his active plasma as a microwave and RF plasma (or hybrid plasma) since it includes species from both microwave excitation and RF excitation. Roppel was able to achieve flexibility by controlling reactive species of the hybrid plasma. However, the operating pressure range was not reported The plasma source appears to operate at pressures well above 1 mtorr because of limited magnetic confinement for both the disk microwave plasma and the hybrid plasma. In fact, FIG. 1 of the 4,691,662 patent depicts some of the magnets 20 located on the sliding plate of the microwave cavity. In the Roppel apparatus, a resonant cavity is used to induce strong microwave electric fields which in turn create the microwave driven plasma inside a quartz dish. In such a source, the frequency required of the power supply decreases inversely proportional to the cross-sectional area of the microwave plasma. Consequently, it is difficult in such a source to create a uniform plasma over a large article at low pressures below 0.1 mtorr as needed for manufacturing microelectronics.

OBJECTS OF THE INVENTION

Accordingly, it is a first object of this invention to use an ECR microwave plasma discharge to feed and initiate an RF discharge in a parallel plate reactor to produce a desired uniform high density plasma at low pressures below 0.1 mtorr.

Another object of the invention is to couple an ECR microwave plasma to an RF plasma in a manner that produces a plasma with improved properties for uniformly treating substrates with large areas.

Another object is to provide an electrically-biased magnetic filter between an ECR microwave plasma discharge and an RF plasma discharge for achieving both operational reliability and plasma uniformity at low pressures.

Still another object is to enhance the flexibility of plasma processing at low pressures by providing a magnetic filter with variable microwave passage and operating with controllable electrical biasing.

Yet another object of this invention is to enhance flexibility of operating over a wide parameter space thereby allowing investigation of design parameters that influence plasmas processing applications.

Another object is to provide a large-area ECR microwave plasma source that is capable of being scaled up in size with minimum effort, thereby simplifying the design of large area ECR microwave and RF plasma reactors.

Yet another object of this invention is to provide an improved dual plasma reactor featuring magnetically enhanced plasma generation for material processing.

Further and other objects and advantages of the present invention will become apparent from the description contained herein.

SUMMARY OF THE INVENTION

A plasma processor incorporating an electron cyclotron resonance (ECR) microwave plasma source to initiate and feed the radio-frequency (RF) plasma of a RF plasma source in a common vacuum chamber is improved as follows:

the microwave plasma source includes static magnetic field producing means located at the walls of the microwave source for producing an ECR zone over a maximum extent of inner wall area, the microwave source operating at ECR and producing a uniform ECR microwave plasma over at least a 1000 cm$^2$ area at a pressure below 0.1 mtorr;

the RF plasma source includes static magnetic field means for producing ECR zones within the RF plasma source; and a magnetic filter is used between the plasma sources, the filter including static magnetic field means and electrically biased plates for affecting the ECR microwave plasma and RF plasma;

the static magnetic field means of the filter also producing ECR zones within the ECR microwave plasma source and the RF plasma source.

BRIEF DESCRIPTION OF THE DRAWINGS

In the drawings:

FIG. 2b is a transverse cross-sectional view of the magnetic filter of FIG. 2a.

For a better understanding of the present invention, together with other and further objects, advantages, and capabilities thereof, reference is made to the following disclosure and appended claims in connection with the above-described drawings.

DETAILED DESCRIPTION OF THE INVENTION

First Embodiment

Figure 1:
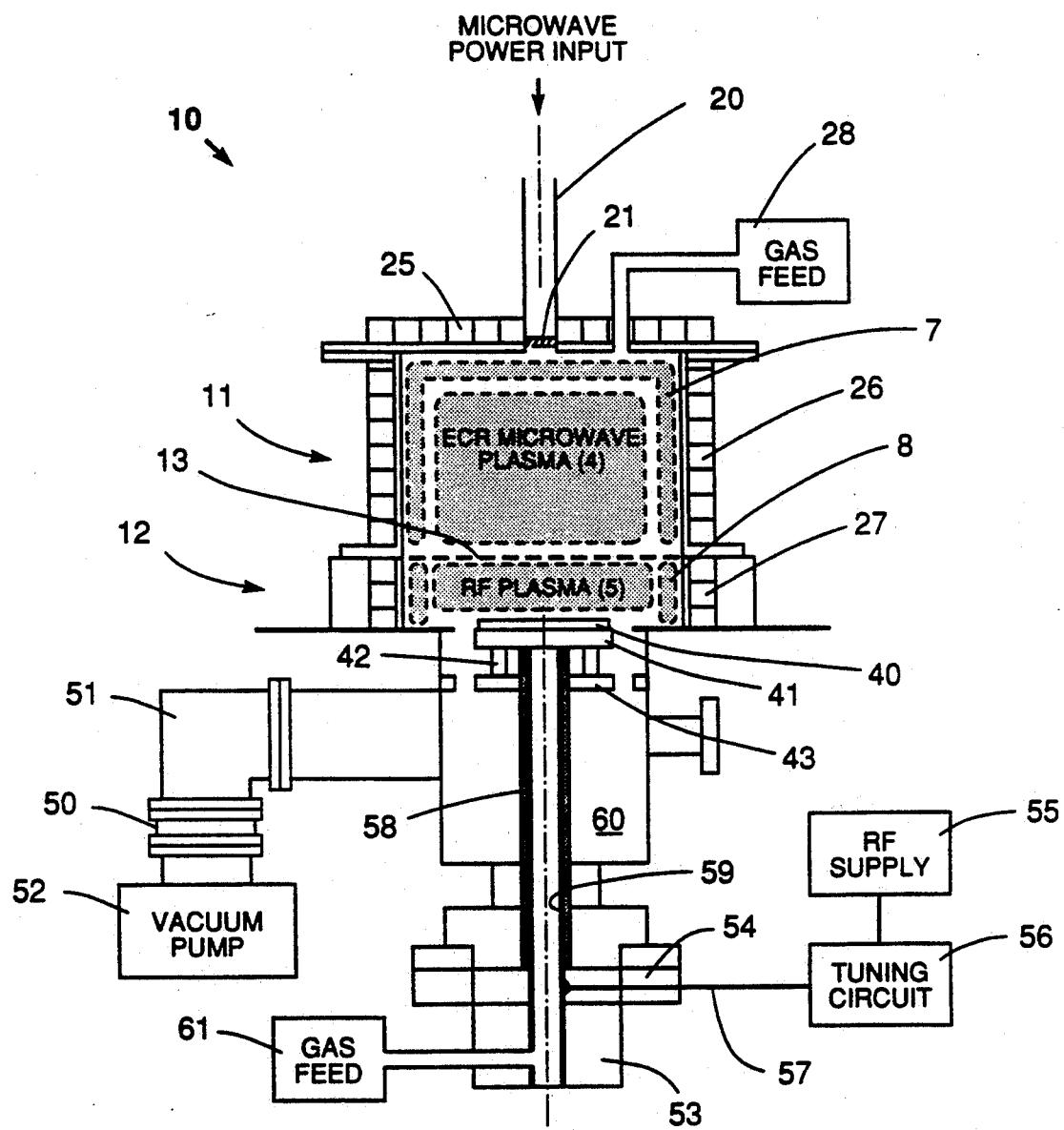
FIG. 1 is a schematic diagram showing an axial cross-sectional view of one embodiment of the plasma generating apparatus of this invention, particularly illustrating a dual plasma source including an initiating ECR microwave plasma 4 and an acting radio-frequency plasma 5.

In FIG. 1, a plasma source 10 featuring two physically separated but coupled plasmas 4 and 5 is described. The source generates a uniform plasma over a large area of about 1000 cm² at low pressures below 0.1 mtorr. A cylindrical vacuum chamber 60 has a pumping region located below the substrate (workpiece) 40 and RF powered substrate holder 41, an upper region where an initiating ECR microwave plasma 4 is generated, and a parallel plate mid region where the radio-frequency (RF) plasma 5 that acts on the substrate 40 is formed. The two plasmas may be operated independently. The ECR microwave multicusp plasma source 11 may use 2.45 GHz microwaves, while the radio-frequency parallel plate plasma generator 12 may be excited with RF at 13.56 MHz, for example.

The electron cyclotron resonance (ECR) microwave multicusp plasma source 11 of Tsai (U. S. Pat. 5,032,202) has been developed to produce plasmas of argon, helium, hydrogen, oxygen, etc., at operating pressures in the range from 0.1 to 10 mtorr. Thus, ECR microwave multicusp plasma sources are known to operate at desired low pressures compared to RF parallel plate plasma generators that typically operate above 100 mtorr and with much difficulty at pressures below 1 mtorr. Thus, the subject invention is a coupled plasma, dual radio-frequency (13.56 MHz) and microwave (2.45 GHz) plasma source that produces a uniform plasma over a large substrate at low pressure with a high fraction of ionization of the cold working gas particles.

Again in FIG. 1, the ECR microwave multicusp plasma source 11 is used to initiate the discharge of the acting plasma 5. Electrons in the ECR microwave plasma 4 drift through the magnetic filter 13 into the RF chamber to initiate and feed the RF plasma 5. The magnetic filter 13 is designed to control microwave entry into the RF plasma region and to enhance reliability and uniformity of the RF discharge at low pressures. In further detail, in the source 11, microwave energy is used to accelerate electrons, which excite and ionize working gas particles and produce an ECR microwave plasma 4. The microwave energy enters the source 11 through a conventional microwave waveguide 20 and microwave entrance window 21.

It will be noted that in Tsai's earlier pat. (5,032,202), a magnet coil/microwave launcher surrounded the microwave window, and magnetic columns surrounded the chamber walls. Such structure resulted in two ECR zones, one in the throat of the microwave launcher and the other at the periphery of the chamber. In the present invention, magnet columns 25 cover the top of chamber 60 and replace the former magnet coil and microwave launcher. This has the result, shown in FIG. 1, of producing a single ECR zone 7 around the entire inner periphery of the ECR microwave multicusp plasma source 11. As in the earlier source, microwave energy in the ECR zone 7 accelerates electrons and produces the ECR microwave plasma 4. The electrons in the ECR microwave plasma 4 subsequently diffuse through the magnetic filter 13 and initiate RF discharges that produce the RF plasma 5 in the (mid) region between the magnetic filter 13 and powered substrate holder 41.

Figure 2A:
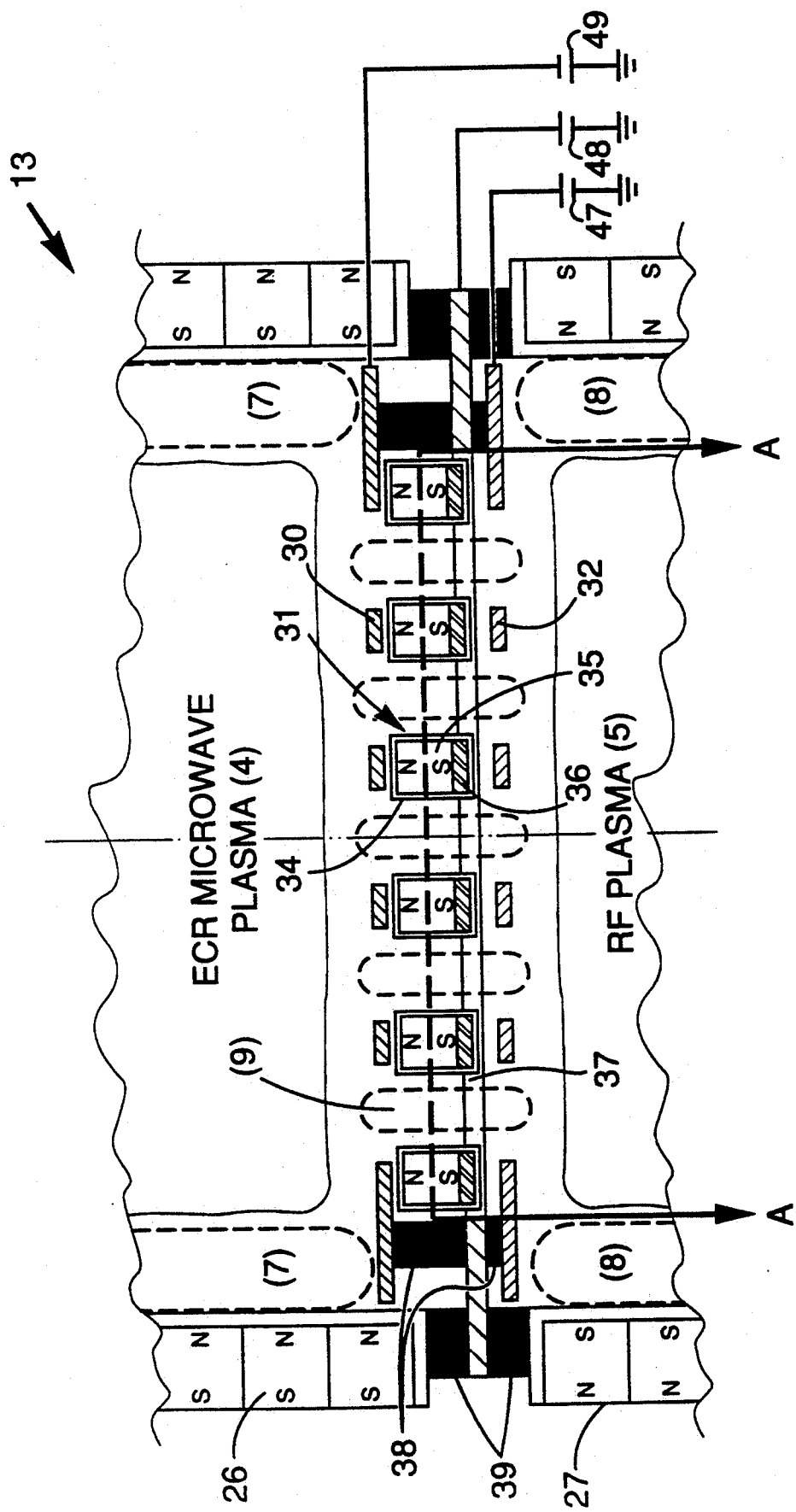
FIG. 2a is an axial cross-sectional view of a magnetic filter used to couple the two plasmas in the apparatus of FIG. 1 and FIG. 3, the magnetic filter including magnets and electrically biased slotted plates for assisting the production of large uniform plasmas at low pressures.
Figure 2B:
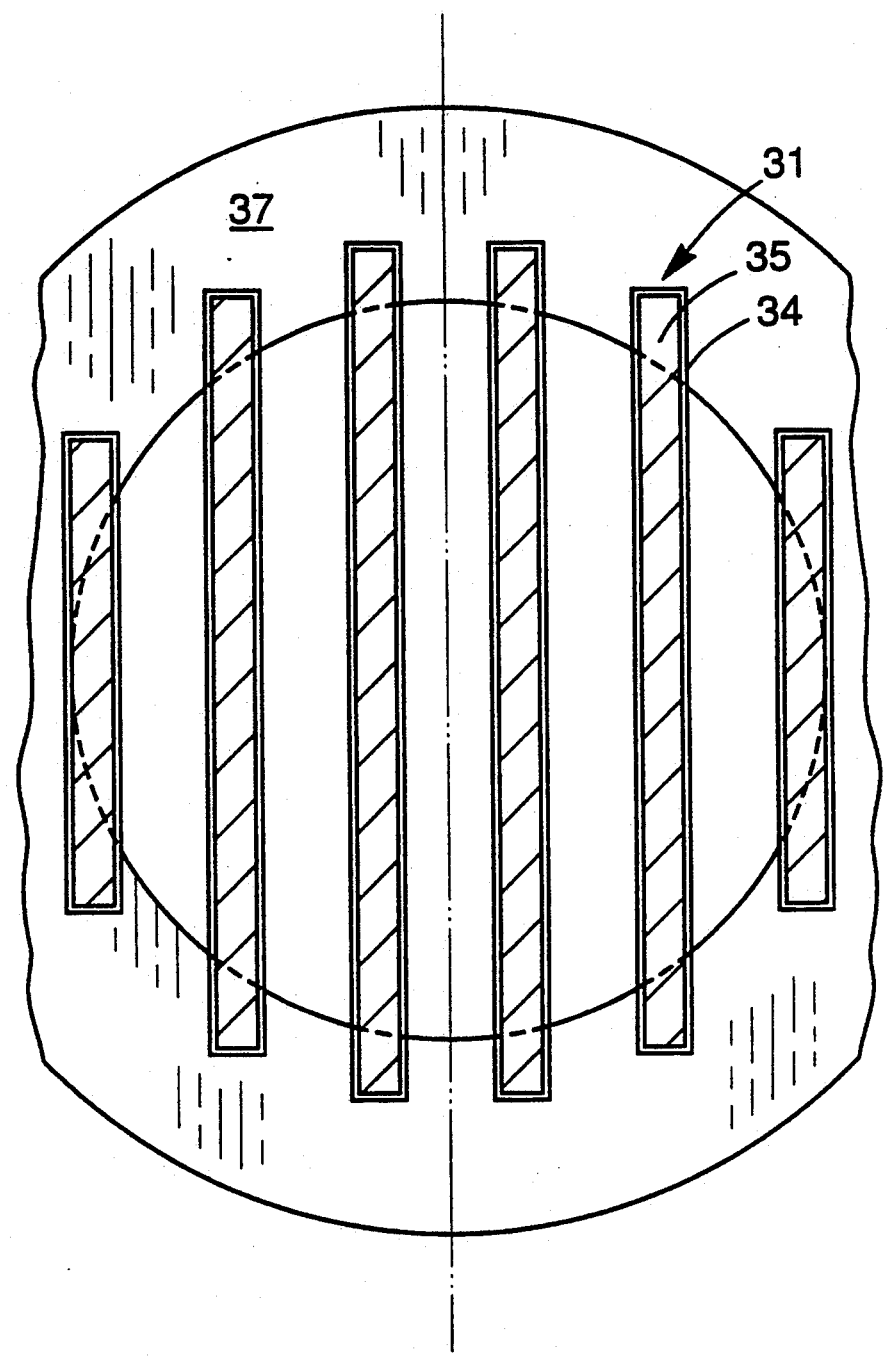

Now in FIGS. 2a and 2b, the magnetic filter 13 includes magnet column assemblies 31 mounted in a metal ring 37, upper slotted plate 30, lower slotted plate 32, and post insulators 38 between these components for electrical separation. Power supplies 47, 48, and 49 are used to bias the plate 32, ring 37 and plate 30, respectively. In the example of FIG. 2a, the upper slotted plate 30 facing the ECR microwave plasma 4 is biased negatively for producing microwave plasmas at low pressures. The lower slotted plate 32 facing the RF plasma 5 is biased positively to accelerate electrons which diffuse from the ECR microwave plasma 4 into the RF plasma 5 through the slot regions between the magnet columns 31. The ring 37 with its associated magnet column assemblies 31 are biased positively with respect to ground to control electron and ion energy distributions. The placement of the magnet columns and the polarity of the power supplies can be optimized for achieving particular plasma properties in the associated application.

The magnet columns 31 of FIG. 2a are assembled by placing strong magnets 35 on a thin soft iron bar 36 where they are held in place by magnetic attraction. When all the magnets are thus placed, the bar magnet assembly is enclosed in an aluminum casing 34. The magnet column assemblies 31 may be press-fit into slots in the metal ring 37 to form a magnetic field of desired configuration in the vacuum chamber 60. In practice, the magnetic filter 13 may be installed in the chamber 60 using ring insulators 39 that electrically insulate it from the two plasma regions. For plasma processing applications, the materials chosen for constructing the coupled plasma source should be relatively inert to the processing gas and plasmas, and be free of impurities generation. Stainless steel, quartz, and anodized aluminum are typical materials of construction. The magnets may be samarium cobalt magnets.

In the invention, the lower limit of operating pressure is extended further by use of proper plasma confining line cusp magnetic field design in both the ECR microwave plasma 4 region and in the RF plasma 5 region.

The enclosing static magnetic field is due to magnet columns 25, 26 in the source 11, magnet columns 27 in the source 12, and bar magnets 35 in the magnetic filter 13. As mentioned previously, the lower slotted plate 32 facing the RF plasma 5 is biased positively to accelerate electrons diffusing through the slot regions between magnet columns. These electrons gain further energy from the applied RF fields in both the ECR zone 8 and the plasma sheath region, i.e., the region of plasma 5 adjacent the powered substrate holder 41. These energetic electrons are reflected by, bounced off of, and contained by the electric and magnetic fields adjacent the RF parallel plates (holder 41 and filter 13) and chamber 60 walls. These energetic electrons ionize the working gas particles and create the RF plasma 5. Because the ECR microwave multicusp plasma source 11 in combination with the magnetic filter 13 distributes the ionizing electrons uniformly over the whole RF discharge chamber area, the RF plasma 5 is likewise uniform, resulting in very uniform processing of the substrate 40.

As mentioned previously, the magnetic columns 27 located on the chamber 60 wall in the region of the RF plasma generator 12 in combination with the magnetic filter 13 form the second ECR zone 8, which is used to contain electrons in the RF plasma 5 and enhance the RF discharge. Utilizing the confined high energy electrons and increased lifetime, the electrons improve the ionization efficiency and produce plasmas at lower pressures. Thus, the lower limit of the source operating pressure can be extended below 0.1 mtorr.

Again in FIG. 1, RF energy is supplied to the RF plasma generator 12 from the commercial RF supply 55. The RF energy passes through the tuning circuit 56, RF coaxial cable 57, and RF feedthrough 54 to a metal tube 59. The tuning circuit 56 is an impedance matching circuit which, in simplest form, may be only a capacitor. The metal tube 59 terminates at the substrate holder 41 to provide the active element, or electrode of the RF parallel plate plasma generator 12. An electrically insulating pyre tube 58 surrounds the metal tube 59. Together, these tubes and mechanical vacuum feedthrough 53 function as a vertically adjustable support pedestal for the substrate holder 41. Insulators 42 isolate the powered substrate holder 41 from its supporting frame 43 inside the pumping region of vacuum chamber 60. Working gas from a source 61 passes through vacuum feedthrough 53 and into the RF plasma generator 12 through the metal tube 59. The gas feeds 28, 61 can be operated independently of each other. The gas pressure in the vacuum chamber 60 is varied by controlling the gas pumping and the gas feeds, and regulating the vacuum valve 50 between the vacuum piping 51 and the turbomolecular vacuum pump 52. With independent control of the applied microwave and RF powers, the dual plasma source 10 can be operated to produce only an ECR microwave plasma 4, only an RF plasma 5, or, in preferred embodiment, coupled plasmas 4 and 5 simultaneously. In order to produce a large and uniform RF plasma 5 at low pressures below 0.1 mtorr, the dual source must be operated in the coupled plasma mode. A further feature of the dual plasma source is that the RF plasma 5, uniform over the substrate 40, is very readily produced. Clearly, the dual source is very flexible for producing various plasmas for various plasma processing applications.

For etching applications, the RF power is applied between the substrate holder 41 and the magnetic filter 13 by means of the RF supply 55 and biasing supplies 47-49. For deposition applications, the RF power would be applied through the filter 13 while the substrate holder 41 would be grounded.

The source shown in FIG. 1 is operated for etching as follows. First, the vacuum chamber is pumped down with the vacuum system to establish the proper vacuum conditions, that is, the proper gas pressure and gas throughput through the system. The gas feed system and throttling valve 50 near the vacuum pump are used to accomplish this. After the gas pressure and gas throughput are established, the source power supplies are warmed up for the feed of the microwaves into the source 11 via the Waveguide 20 and window 21. At the same time, a choice of biasing parameters is made for the magnetic filter 13, and these parameters are a priori set at the power supplies 47-49.

Next, the ECR microwave plasma is established without much regard to the RF plasma generation. Using some relatively low pressure and low microwave feed, microwave power is introduced into the vacuum chamber. Upon entering the chamber, the microwaves bounce around. At specific resonant zones 7-9 as determined by the magnetic fields surrounding the chamber, electrons gain energy from microwave fields to initiate discharges in the plasma regions 4, 5. The electrons heated in specific resonant zones 7-9 are confined by the cusp fields and aid in the formation of the uniform plasmas 4 and 5. The magnets 25-27 and 35 provide two functions; they provide the resonant zones for the microwaves for the heating of electrons, and they provide the plasma confinement.

The next task is to vary the potentials on the filter region at the power supplies 47-49. During this step, the ion and electron density in the RF plasma 5 region is measured, either by a probe or by monitoring the current on the substrate holder 41. This may be done by placing a potential on the substrate holder 41, statically at first, then negative and positive, varying them to understand what kind of plasma is being created in the RF region. By an external mechanism such as a probe in the RF plasma region, the plasma variations resulting from placing the RF potential on the workpiece holder are then determined.

Next, the applied microwave power, pressure, electrical potentials on the magnetic filter 13, and RF potentials on the workpiece holder 41 are varied until the desired plasma uniformity, density, ion energy, and electron energy parameters are attained. There remains one further parameter for plasma control. Since the plasma uniformity over the substrate holder is a complicated result of the parameters mentioned, the workpiece holder may be moved up and down in the vacuum chamber to take advantage of the most uniform plasma location. Of course, this may also require subsequent iteration of the parameters mentioned before.

It will be understood that the particular static magnetic field configurations used in this invention improve the efficiency of plasma generation in both plasma regions 4, 5. Microwave introduction into both regions 4, 5 is controlled by the design and geometry of the various components, and the microwave energy in the ECR zones accelerates electrons to high energy which enhances the plasma production. But it is not just more efficient plasma production; whenever efficiency is increased, the pressure can also be lowered—one of the most desired parameters in plasma processing sources.

Second Embodiment

Figure 3:
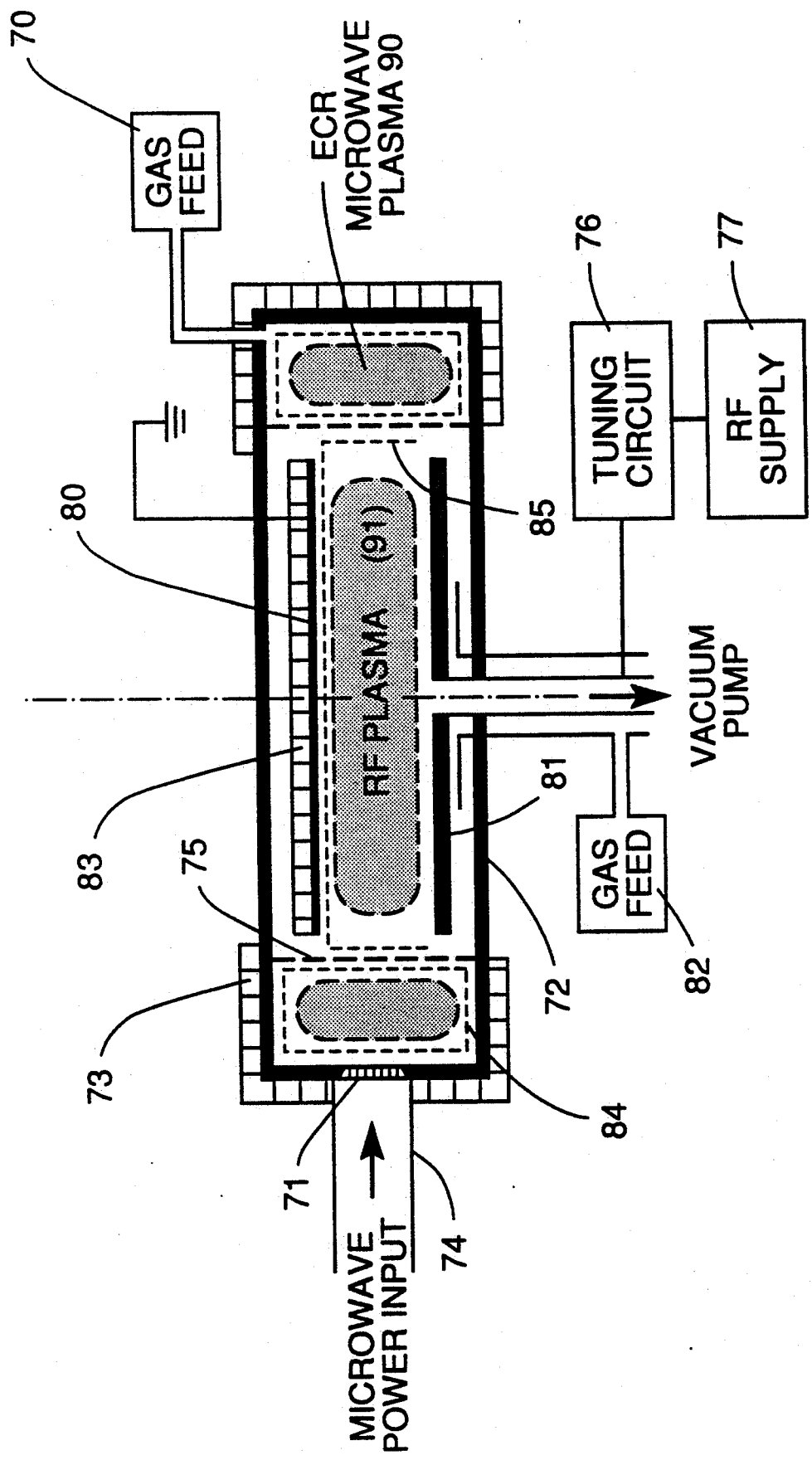
FIG. 3 is a schematic diagram showing an axial cross-sectional view of an alternative dual plasma source for plasma processing of the invention, particularly illustrating a parallel plate geometry featuring a peripheral initiating ECR microwave plasma 90 and an acting radio-frequency plasma 91.

FIG. 3 illustrates an alternate version of the dual plasma source. Like the source of FIG. 1, it utilizes an ECR microwave plasma initiating and feeding an RF plasma; the construction of the vacuum chamber and use of the magnetic filter is different. In this source, the vacuum chamber 72 is again cylindrical. It has an outer peripheral region for forming a circumferential ECR microwave plasma 90 and an inner parallel plate region for forming the RF plasma 91. As before, the source pressure is controlled by gas pumping and the working gas feeds 70 and 82 to the plasma 90, 91 regions, respectively. The ECR microwave plasma 90 is produced in the chamber 72 by applying microwave power via the microwave waveguide 74 and microwave entrance window 71 into the ECR microwave plasma region. One or more microwave feeds may be needed to fill the peripheral region with microwaves.

Magnet columns 73 are placed around the vacuum chamber 72 walls in the region of the plasma 90. As before, electrons in the region are accelerated by the microwave electric field, ionize working gas particles, and produce an ECR zone 84 for the ECR microwave plasma 90. Electrons from the plasma 90 diffuse through the magnetic filter 75, enter the RF plasma 91 region, and initiate an RF discharge between the parallel plates 80 and 81. The magnetic filter 75 is similar to the one shown and described in the embodiment of FIG. 1.

The RF electric field from the RF supply 77 and tuning circuit 76 is applied between the substrate holder 81 and parallel plate 80. The electrons in the RF plasma 91 region are accelerated, ionize the working gas particles, and form the ECR zone 85 from which the RF plasma 91 is produced. The ECR zone 85 forms due to the nearby static magnetic field from the magnetic filter 75 and magnet columns 83 located on parallel plate 80.

For etching applications, the RF power is applied to the substrate holder 81 on which the substrate is fastened, and the parallel plate 80 is the grounded electrode. For deposition applications, the RF power is applied to the parallel plate 80, while the substrate holder 81, on which the working piece is fastened, would be grounded.

It will be noted in FIG. 3 that the RF plasma 91 is formed between plates 80 and 81 similar to a parallel plate reactor. In the embodiment of FIG. 1, the RF plasma 5 is formed between the magnetic filter 13 and powered substrate holder 41, both together functioning in the manner of two parallel plates. With the improvement in electron confinement achieved by use of the magnet columns 73, 83, and the magnetic filter 75, the plasma source of FIG. 3 is also capable of operating at low pressures of 0.1 mtorr and below.

The source of FIG. 3 is operated for etching like that of FIG. 1. The microwaves bounce around in the plasma 90, 91 regions. The ECR microwave plasma 90 is formed in the outer peripheral region of the vacuum chamber 72. Electrons gain energy from microwaves applied in the ECR zone 84 and produce this plasma at very low pressure, below 0.1 mtorr. With the plasma 90 created, the plasma electrons pass through the magnetic filter 75 into the RF plasma 91 region. The electrons gain further energy from 1) microwaves that are introduced through the filter 75, 2) the ECR resonance zone 85, and 3) RF power applied to the substrate holder 81. The uniform RF plasma is then used for plasma etching on the substrate.

Some of the major features and advantages of the coupled plasma sources of the invention are described below:

1. Reliability. The coupled plasma sources are expected to operate as reliably as the ECR microwave plasma source of prior invention at low pressures of 0.1mtorr. The sources provide the flexibility of control of plasma current density and variable ion energy desired for materials processing.

2. Efficiency. The plasma sources are designed with magnetic multicusp configurations that closely confine both of the coupled plasmas.

3. Configuration. The plasma sources can be configured with various other geometries, e.g. sphere, cylinder, tube, etc. In the version of FIG. 1, the physical separation of the two discharges enhances the flexibility for performing etching and deposition processes. It allows large plasma reactors to be designed for mass production. The alternative design of FIG. 3 can also be used for both etching and deposition applications.

4. Magnetic filter. The magnetic filter improves the discharge stability and plasma confinement of both embodiment of the invention, and reduces the plasma impurity content from the chamber walls. The capability to perform plasma deposition at low pressure reduces impurity clusters. Impurity clusters form in the gas phase, deposit as thin films, degrade the quality of the process, and damage substrate films. Improvement in plasma confinement and reduction in impurity content enhances the operating efficiency of the plasma reactor. Moreover, the magnetic configuration in the magnetic filter can be designed to perform particular etching or deposition applications, controlling charged or neutral particles that pass through the magnetic filter from the ECR microwave plasma 4 to the RF plasma 5. In addition to providing magnetic biasing, the magnetic filter provides independent electrical biasing of the slotted plates 30 and 32 and the magnet assemblies 31 both in magnitude and in polarity to control properties of the RF plasma for special etching and deposition applications.

5. Flexibility. This invention provides for independent control of operating parameters in the target region such as gas pressure, gas species, microwave power, microwave frequency, RF frequency, and RF power.

6. Simplicity. The sources provide simple mechanical structures for producing uniform plasmas at low pressures.

7. Dual source. The sources uses ECR microwave plasmas to initiate RF discharges and produce uniform plasmas between RF parallel plates for manufacturing microelectronics.

8. Operation Increased microwave introduction into the rf plasma generator enhances the rf discharge. Reduced microwave power in the RF plasma region reduces the risks of damage to the microfeatures being processed.

While there has been shown and described what are at present considered the preferred embodiments of the invention, it will be obvious to those skilled in the art that various changes and modifications can be made therein without departing from the scope of the inventions defined by the appended claims.

We claim:

1. In a plasma processor incorporating an electron cyclotron resonance (ECR) microwave plasma source to initiate and feed the radio-frequency (RF) plasma of a RF plasma source in a common vacuum chamber, the improvement comprising:

said microwave plasma source including static magnetic field producing means located at the walls of said microwave source for producing an ECR zone over a maximum extent of inner wall area, said microwave source operating at ECR and producing a uniform ECR microwave plasma over at least a 1000 $cm^2$ area at a pressure below 0.1 mtorr;

said RF plasma source including static magnetic field means for producing ECR zones within said RF plasma source; and a magnetic filter between said plasma sources, said filter including static magnetic field means and electrically biased plates for affecting said ECR microwave plasma and said RF plasma;

said static magnetic field means of said filter also producing ECR zones within said ECR microwave plasma source and said RF plasma source.

2. In the plasma processor of claim 1, the walls of said microwave plasma source and said RF plasma source being right circular cylindrical;

said magnetic filter having a right circular cylindrical geometry; and said ECR microwave plasma source, said magnetic filter, and said RF plasma source being arranged along a common axis.

3. In the plasma processor of claim 1, said RF plasma source being right circular cylindrical;

said magnetic filter having a circumferential geometry, and being disposed coaxially about said RF plasma source; and said ECR microwave plasma source having a circumferential geometry, and being disposed coaxially about said magnetic filter.

4. A plasma processor according to claim 3 further including a second ECR microwave plasma source, the walls of said second ECR microwave plasma source being right circular cylindrical, said plasma processor and said second ECR microwave plasma source being arranged along a common axis, and said second ECR microwave plasma source providing a second microwave feed into said RF plasma source for added flexibility in plasma processing.

5. In the plasma processor of claim 1, said magnetic filter including bar-shaped magnet column assemblies mounted in a metal ring, said metal ring disposed between two slotted plates, said ring and said slotted plates being capable of independent electrical biasing through individual power supplies.

6. The plasma processor of claim 1 wherein said microwave plasma source is turned on and said RF plasma source is turned off.

7. The plasma processor of claim 1 wherein said microwave plasma source is turned off and said RF plasma source is turned on.

8. The plasma processor of claim 1 wherein said microwave plasma source is turned on and said RF plasma source is turned on.

* * * * *